United States Patent
Chen et al.

(10) Patent No.: US 7,511,350 B2
(45) Date of Patent: *Mar. 31, 2009

(54) NICKEL ALLOY SILICIDE INCLUDING INDIUM AND A METHOD OF MANUFACTURE THEREFOR

(75) Inventors: Peijun J. Chen, Dallas, TX (US); Duofeng Yue, Plano, TX (US); Amitabh Jain, Allen, TX (US); Sue Crank, Coppell, TX (US); Thomas D. Bonifield, Dallas, TX (US); Homi Mogul, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/018,313

(22) Filed: Jan. 23, 2008

(65) Prior Publication Data

US 2008/0128837 A1  Jun. 5, 2008

Related U.S. Application Data

(60) Division of application No. 11/551,374, filed on Oct. 20, 2006, now Pat. No. 7,344,985, which is a continuation-in-part of application No. 11/096,660, filed on Apr. 1, 2005, now Pat. No. 7,211,516.

(51) Int. Cl.
*H01L 29/78* (2006.01)

(52) U.S. Cl. .............. 257/412; 257/382; 257/384; 257/388; 257/413; 257/E21.439

(58) Field of Classification Search .............. 257/382, 257/384, 388, 412, 413, E21.439
See application file for complete search history.

(56) References Cited

U.S. PATENT DOCUMENTS

| 7,319,065 B1 * | 1/2008 | Yu et al. ............. 438/622 |
| 7,355,255 B2 * | 4/2008 | Chen et al. .......... 257/388 |
| 2002/0061639 A1 * | 5/2002 | Itonaga ............. 438/592 |
| 2003/0155582 A1 * | 8/2003 | Mahajani et al. ...... 257/200 |
| 2005/0158996 A1 * | 7/2005 | Kim et al. ........... 438/664 |

* cited by examiner

*Primary Examiner*—Evan Pert
*Assistant Examiner*—Tan N Tran
(74) *Attorney, Agent, or Firm*—Warren J. Franz; Frederick J. Telecky, Jr.; Wade J. Brady, III (57) ABSTRACT

The invention provides a semiconductor device, a method of manufacture therefore and a method for manufacturing an integrated circuit including the same. The semiconductor device, among other elements, may include a gate structure located over a substrate, the gate structure including a gate dielectric layer and gate electrode layer. The semiconductor device may further include source/drain regions located in/over the substrate and adjacent the gate structure, and a nickel alloy silicide located in the source/drain regions, the nickel alloy silicide having an amount of indium located therein.

5 Claims, 6 Drawing Sheets

NICKEL ALLOY SILICIDE INCLUDING INDIUM AND A METHOD OF MANUFACTURE THEREFOR

CROSS-REFERENCE TO RELATED APPLICATIONS

This application is a divisional application of application Ser. No. 11/551,374 filed on Oct. 20, 2006 (now pending), which is a continuation-in-part of U.S. patent application Ser. No. 11/096,660 filed on Apr. 1, 2005 (now patented as U.S. Pat. No. 7,211,516 on May 1, 2007) entitled Improved Nickel Silicide Including Indium and a Method of Manufacture Therefor.

This application is a continuation-in-part of U.S. patent application Ser. No. 11/096,660, entitled "IMPROVED NICKEL SILICIDE INCLUDING INDIUM AND A METHOD OF MANUFACTURE THEREFOR", filed on Apr. 1, 2005. The above-listed application is commonly assigned with the invention and is incorporated herein by reference as if reproduced herein in its entirety.

TECHNICAL FIELD OF THE INVENTION

The invention is directed, in general, to a method for manufacturing a semiconductor device and, more specifically, to an improved nickel alloy silicide including indium, a method of manufacture therefore, and a method for manufacturing an integrated circuit including the same.

BACKGROUND OF THE INVENTION

Traditional metal-oxide-semiconductor (MOS) transistors often use metal silicide layers to reduce resistance. A self-aligned silicidation process (salicide) is often used to form the region of titanium, cobalt or tungsten silicide on the gate electrode and source/drain regions of the MOS transistor. In this process, a blanket metal film is deposited on the silicon substrate containing the MOS transistor structure. The metal is then reacted with the underlying silicon regions to form a low resistance metal silicide. Any unreacted metal remaining on the substrate is then removed using a metal etch process that is selective to the remaining metal silicide.

In order to reduce the resistances associated with the metal silicide regions, nickel is finding increasing use in forming the metal silicide regions in MOS transistors, particularly for transistors with physical gate lengths of less than 65 nm and/or MOS transistors with ultra-shallow junctions. Nickel has a very high diffusivity in silicon leading to the formation of nickel silicide regions that extend beneath the transistor sidewall structures. The nickel silicide regions that extend beneath the transistor sidewall structures tend to lead to nickel silicide excessive encroachment defects extending into the channel region of the MOS transistor. In a similar manner, the high diffusivity of nickel causes excessive spike defects into the source/drain regions. As would be expected, the encroachment and spike defects tend to cause serious acceptance, manufacturability, and ultimately device yield problems.

There is therefore a need for a method to form nickel silicide regions in MOS transistors that does not experience the problems of traditional methods.

SUMMARY OF THE INVENTION

To address the above-discussed deficiencies of the prior art, the invention provides a semiconductor device, a method of manufacture therefore and a method for manufacturing an integrated circuit including the same. The semiconductor device, among other elements, may include a gate structure located over a substrate, wherein the gate structure includes a gate dielectric layer and gate electrode layer. The semiconductor device may further include source/drain regions adjacent the gate structure, and a nickel alloy silicide located in the source/drain regions that has indium located therein.

As previously noted, another aspect of the invention is a method for manufacturing a semiconductor device. The method for manufacturing the semiconductor device may include forming a gate structure over a substrate that includes a gate dielectric layer and gate electrode layer. The method may also include forming source/drain regions adjacent the gate structure. The method may further include placing indium in the source/drain regions to form an indium region in each of the source/drain regions. A nickel alloy layer is formed over the source/drain regions, and the nickel alloy layer is annealed to form a nickel alloy silicide in at least a portion of the indium region located in each of the source/drain regions.

A method for manufacturing an integrated circuit is further provided as provided above including forming interconnects within dielectric layers located over the gate structures to interconnect the gate structures, a portion of the interconnects contacting the nickel alloy silicide.

BRIEF DESCRIPTION OF THE DRAWINGS

For a more complete understanding of the invention, reference is now made to the following descriptions taken in conjunction with the accompanying drawings, in which.

DETAILED DESCRIPTION

The invention is based, in part, on the inclusion of indium into a nickel silicidation process. The invention recognizes that the inclusion of indium, during a nickel silicidation process, retards encroachment defects and spike, which are attributable to the high diffusivity of nickel. In addition to retarding the formation of encroachment and spike defect, indium also provides silicidation uniformity. Moreover, indium provides a lower resistance contact between the silicide region and the source/drain region or the gate electrode layer, than that previously obtained by other methods. Thus, the use of indium does not introduce the contact resistance degradation that may occur with antimony, germanium, or other dopants.

Accordingly, indium allows efficient defect reduction in nickel silicides with lower cumulative ion implantation damage, due to its higher atomic mass. The reduction of lower defects and cumulative ion implantation damage provides a semiconductor device with improved performance. Similarly, indium can minimize pMOS transistor drive current degradation, as compared to other species, such as germanium, because it is a p-type dopant that can be activated at relatively low temperatures. Therefore, the silicide/diffusion specific contact resistance is improved. Furthermore, the indium does not experience the large yield degradation that antimony or germanium experiences. For example, more cumulative implant damage exists beyond the amorphized silicon for lower atom mass atoms, such as germanium.

Figure 1A:
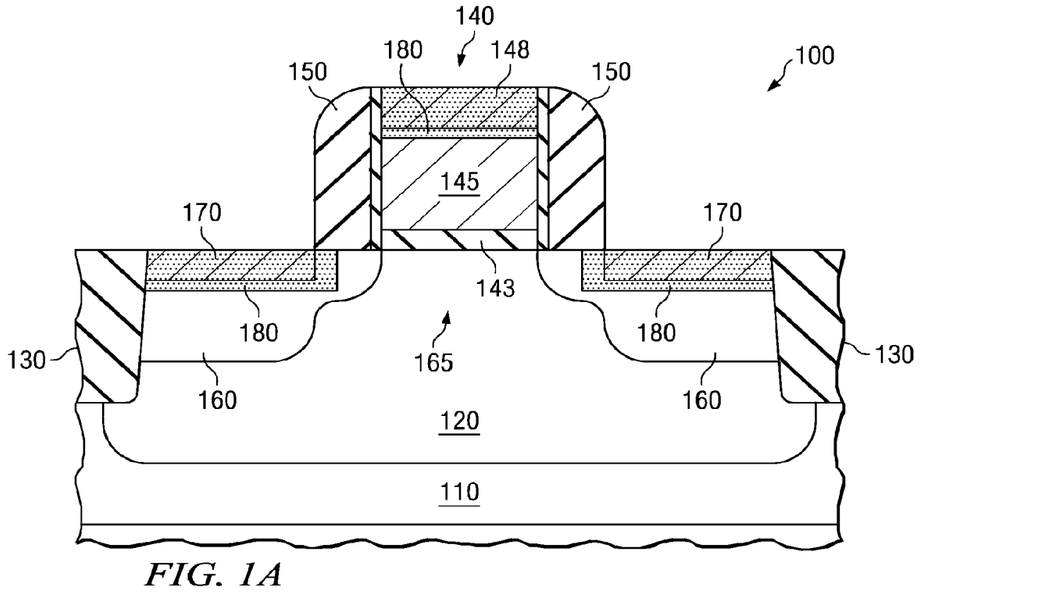
FIGS. 1A-1C illustrate different embodiments of a semiconductor device constructed according to the principles of the invention.

FIG. 1A illustrates a semiconductor device 100 constructed according to the principles of the invention. The semiconductor device 100 of FIG. 1A initially includes a substrate 110 having a well region 120 located therein. Located over the well region 120, and separated by isolation structures 130, is a gate structure 140. The gate structure 140 includes a gate dielectric layer 143, a gate electrode layer 145, and a nickel alloy silicide gate electrode layer 148. Flanking both sides of the gate structure 140 are sidewall spacers 150. While it is illustrated in FIG. 1A that the sidewall spacers 150 comprise multiple layers, such is not always the case.

Source/drain regions 160 are located adjacent the gate structure 140. Adjacent source/drain regions 160 include those that may be located in the substrate 110 or located over the substrate 110. The source/drain regions 160, as is appreciated by one skilled in the art, are separated from one another by a distance, thereby forming a channel region 165. Positioned within the source/drain regions 160 are areas of nickel alloy silicide 170.

In one example, the nickel alloy silicide 170 may be a nickel platinum silicide. For instance, the nickel platinum silicide might include about 95 wt. % nickel and about 5 wt. % platinum. Other alloys could also be used in this or other combinations.

Either one or both of the nickel alloy silicide 170 or nickel alloy silicide gate electrode layer 148 also includes indium. The indium, in the embodiment illustrated in FIG. 1A, is contained within indium regions 180 that encompass at least a portion of the nickel alloy silicide 170 or nickel alloy gate electrode layer 148. In one embodiment, the indium regions 180 encompass the entire nickel alloy silicide 170 or nickel alloy silicide gate electrode layer 148. Accordingly, in this embodiment, the nickel alloy silicide 170 or nickel alloy silicide gate electrode layer 148 are formed entirely within a boundary created by the indium regions 180. To achieve this, a minimum concentration of indium of at least about 1E19 atoms/cm$^3$ should, in one embodiment, extend from about 8 nm to about 40 nm into the surface. In such instances, an appropriate concentration of indium may be located at an interface between one or both of the nickel alloy silicide 170 or nickel alloy silicide gate electrode layer 148, and the source/drain regions 160 or gate electrode layer 145, respectively. In certain instances, the indium may advantageously pile-up at this interface and provide a lower resistance contact. Certain other atoms, such as germanium and antimony, have not been observed to advantageously pile-up, such as indium has.

The indium regions 180 constructed in accordance with the principles of the invention typically have a peak indium concentration of greater than about 1E19 atoms/cm$^3$. In many instances, however, the peak concentration of indium ranges from about 5E19 atoms/cm$^3$ to about 5E20 atoms/cm$^3$. In one embodiment, the peak concentration is tied to the indium dose required to form an amorphous silicon region, which is formed by the implantation of the indium into the silicon substrate. However, other concentrations outside of those just disclosed are within the scope of the invention.

Figure 1B:
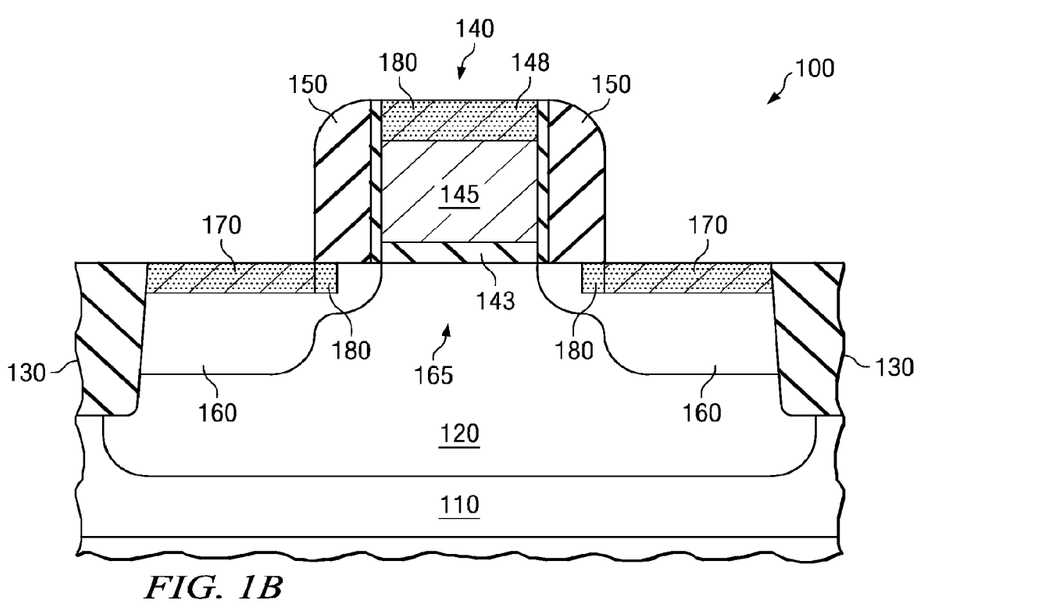

FIG. 1B is another embodiment of a semiconductor device manufactured in accordance with the principles of the invention. The semiconductor device 100 illustrated in FIG. 1B is substantially similar to the semiconductor device 100 illustrated in FIG. 1A; thus, similar reference numbers denote similar features. However, one difference between the semiconductor devices 100 of FIGS. 1A and 1B is the position of nickel alloy silicide 170 or nickel alloy silicide gate electrode layer 148 with respect to the indium regions 180. For example, while the indium regions 180 extend past the nickel alloy silicide 170 or nickel alloy silicide gate electrode layer 148 in the embodiment of FIG. 1A, the indium regions 180 and nickel alloy silicide 170 or nickel alloy silicide gate electrode layer 148 are substantially coincident in the embodiment of FIG. 1B. Further, while not shown in FIG. 1B, the lateral dimensions of the indium regions 180 and nickel alloy silicide 170 or nickel alloy silicide gate electrode layer 148 may also be substantially coincident.

Figure 1C:
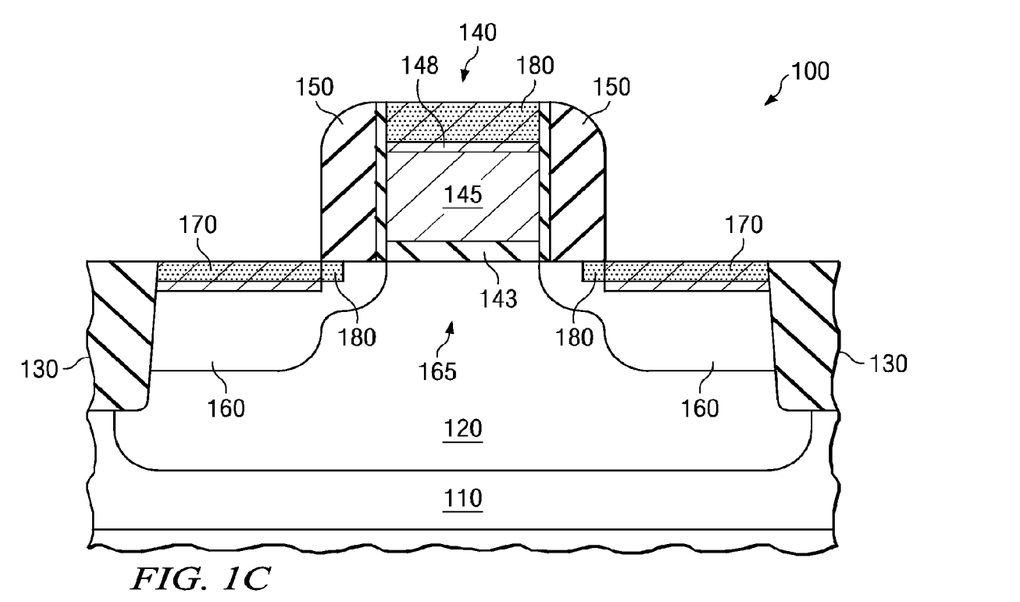

FIG. 1C is another embodiment of a semiconductor device manufactured in accordance with the principles of the invention. The semiconductor device 100 illustrated in FIG. 1C is substantially similar to the semiconductor device 100 illustrated in FIGS. 1A and 1B, thus, similar reference numbers denote similar features. One of differences between the semiconductor devices 100 of FIGS. 1A and 1B, and 1C, is the position of nickel alloy silicide 170 or nickel alloy silicide gate electrode layer 148 with respect to the indium regions 180. In this embodiment, one or both of the nickel alloy silicide 170 or nickel alloy silicide gate electrode layer 148 extend past the indium regions 180. Further, while not shown in FIG. 1C, the lateral dimensions of the indium regions 180 could be such that the indium regions 180 are entirely within a boundary created by one or both of the nickel alloy silicide 170 or nickel alloy silicide gate electrode layer 148.

FIGS. 2-6 illustrate views of detailed manufacturing steps instructing how one might, in one embodiment, manufacture a semiconductor device in accordance with the principles of the invention. The semiconductor device 200 of FIG. 2 includes a substrate 210. The substrate 210 may be any layer located in the semiconductor device 200, including a wafer itself or a layer located above the wafer (e.g., epitaxial layer). In the illustrated embodiment, the substrate 210 is apable of silicidation.

Figure 2:
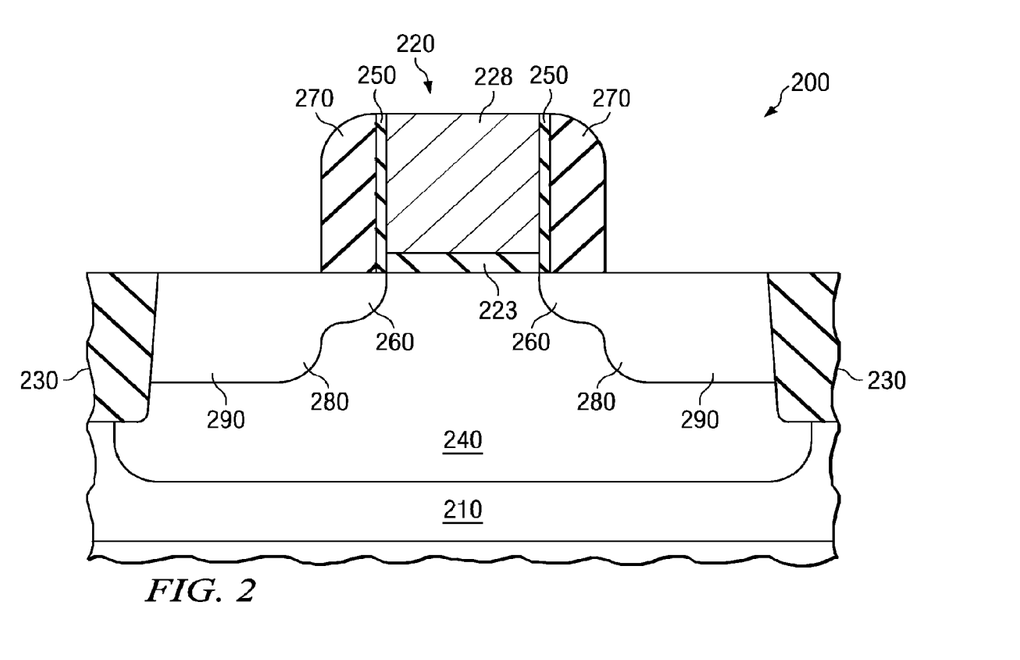
FIG. 2 illustrates a semiconductor device at an initial stage of manufacture.

As illustrated in FIG. 2, a gate structure 220 is formed over the substrate 210. The gate structure 220, in the embodiment shown, includes a gate dielectric layer 223 and a gate electrode layer 228. The gate dielectric layer 223 may, for example, comprise an oxide, thermally grown SiO$_2$, a nitride, an oxynitride, or any combination thereof, and may have a thickness ranging from about 1 nm to about 20 nm. The gate dielectric layer 223 can also be formed using a high K dielectric material with a dielectric constant greater than about 3.9. Some examples of high K dielectric material include hafnium-containing dielectrics such as hafnium oxide, hafnium oxynitride, etc.

As previously indicated, the gate structure 220 further includes a gate electrode layer 228. The gate electrode layer 228, in one embodiment, comprises a layer of silicon-containing material formed on the gate dielectric layer 223. Preferably, this silicon-containing material is comprised of polycrystalline silicon ("poly" or "polysilicon"), but it may comprise amorphous silicon, epitaxial silicon or any other semiconducting material. Accordingly, the gate electrode layer 228 may comprise a silicidable material.

Located within the substrate 210 and between isolation regions 230 is a well region 240. The well region 240 in the substrate 210 shown in FIGS. 2-7 can be either n-type or p-type. In forming CMOS integrated circuits, n-type and p-type well regions 240 are formed in the substrate 210. In the case of an n-well region, a PMOS transistor will be formed. In a similar manner for a p-well region, an NMOS transistor will be formed.

After the formation of gate structure 220, a spacer 250 is formed, for example, by first thermally growing about 1 nm to about 5 nm of oxide followed by depositing about 15 nm of TEOS oxide. In other embodiments the spacer 250 can comprise a combination of silicon nitride and/or silicon oxide (either grown or deposited) layers.

For a pMOS transistor where the well region 240 comprises a portion of an n-type well, a blanket p-type lightly doped implant is performed resulting in the lightly doped extension implants 260. The p-type lightly doped extension implants 260 are often referred to as lightly doped drain (LDD) or moderately doped drain (MDD) extension regions. The p-type lightly doped extension implants 260 may be conventionally formed and generally have a peak dopant concentration ranging from about 1E19 atoms/cm$^3$ to about 2E20 atoms/cm$^3$.

In addition to the p-type lightly doped extension implants 260, pocket implants (not shown) are sometimes performed. For the case where the semiconductor device 200 shown in FIG. 2 is a PMOS transistor, the pocket implants would comprise an n-type dopant species. Pocket implants may refer to an implant that is used to reduce the effect of the short transistor gate length on transistor properties, such as threshold voltage. The effect of the pocket implant is not however limited to threshold voltage. The pocket implant for a particular transistor type usually results in a doping profile that extends beyond the drain extension of the transistor. The species of the n-type pocket implant can consist of As, P or any other suitable n-type dopant. The species of the p-type lightly doped extension implants 260 can consist of boron or any other suitable p-type dopant. The order of the implants is somewhat arbitrary and the pocket implant can be performed before the p-type lightly doped extension implants 260.

For an NMOS transistor where well region 240 comprises a portion of a p-type well, a blanket n-type lightly doped implant is performed resulting in n-type lightly doped extension implants 260. The n-type lightly doped extension implants 260 are also often referred to as a lightly doped drain (LDD) or a moderately doped drain (MDD) extension region. The n-type lightly doped extension implants 260 may be conventionally formed and generally have a peak dopant concentration ranging from about 1E19 atoms/cm$^3$ to about 2E20 atoms/cm$^3$.

In addition to the n-type lightly doped extension implants 260, pocket implants are again sometimes performed. For the case where the transistor shown in FIG. 2 is an NMOS transistor, the pocket implant would comprise a p-type dopant species. The species of the p-type pocket implant can consist of B, BF$_2$, Ga, In, or any other suitable p-type dopant. The species of the n-type lightly doped extension implants 260 can consist of As, P, Sb, or any other suitable n-type dopant. The order of the implants may vary with design and the n-type lightly doped extension implants 260 could be performed before the pocket implant.

After the completion of the lightly doped extension implants 260 (and pocket implant if performed), and any subsequent processing, sidewall spacers 270 are formed as shown in FIG. 2. In one embodiment, the sidewall spacers 270 comprise a plurality of silicon oxide and silicon nitride dielectric layers. The sidewall spacers 270 are formed by first depositing blanket layers of suitable dielectric material. An anisotropic etch is then used to form the sidewall spacers 270. The sidewall spacers 270 can also be formed using a single suitable dielectric material such as silicon nitride or silicon oxide.

Following the formation of the sidewall spacers 270, highly doped source/drain implants 280 are formed. For a PMOS transistor, p-types dopants, such as boron, are implanted into the substrate 210 adjacent to the sidewall spacers 270 to form the highly doped source/drain implants 280. For an NMOS transistor, n-type dopants, such as arsenic and/or phosphorous, are implanted into the substrate 210 adjacent to the sidewall spacers 270 to form the highly doped source/drain implants 280. The highly doped source/drain implants 280 are conventionally formed and generally have a peak dopant concentration ranging from about 1E18 atoms/cm$^3$ to about 1E21 atoms/cm$^3$.

Following the formation of the highly doped source/drain implants 280, a high temperature source/drain anneal may be performed to activate the implanted dopants and remove the damage to the substrate 210 created during the ion implantation process. What results are source/drain regions 290. The source/drain anneal can comprise a rapid thermal annealing (RTA) process where the source/drain regions 290 are annealed at temperatures above about 800° C. for times ranging from about a second to minutes.

The source/drain regions 290 illustrated in FIG. 2 happen to be standard implanted source/drain regions. Another embodiment exists wherein the source/drain regions 290 are raised source/drain regions. In this embodiment, trenches may be formed in the substrate 210 proximate both sides of the gate structure 220 and thereafter filled with a material, such as silicon germanium. The silicon germanium would then act as the material within which the source/drain regions 290 are formed. Regardless of the type of source/drain regions 290 used by the invention, the use of indium remains substantially the same.

Figure 3:
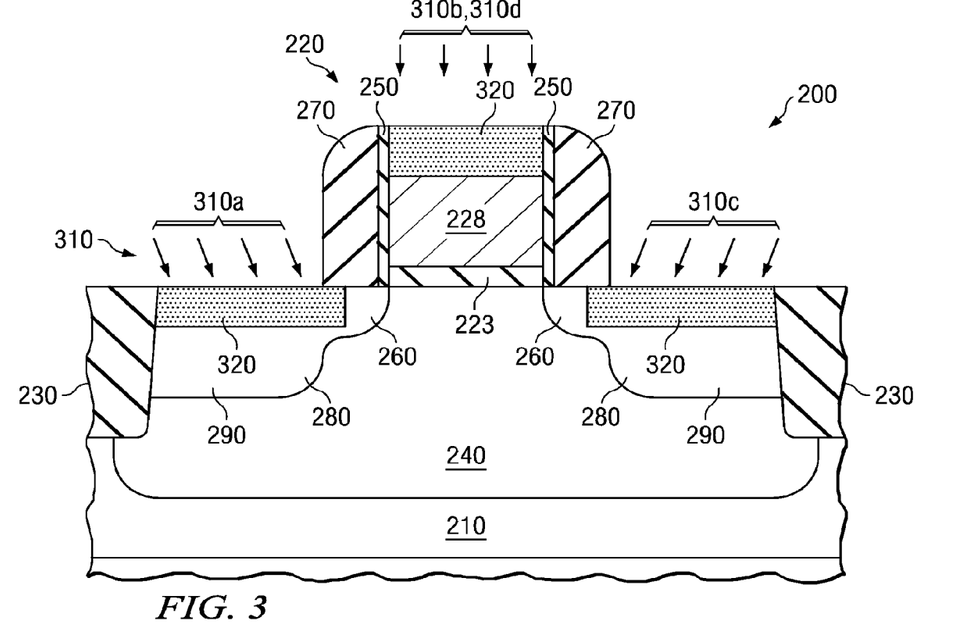
FIG. 3 illustrates the semiconductor device of FIG. 2 after placing an indium region in one or both of the substrate and gate electrode layer.

FIG. 3 illustrates a cross-sectional view of the semiconductor device 200 illustrated in FIG. 2 after placing an indium region 320 in one or both of the substrate 210 and gate electrode layer 228. In the embodiment of FIG. 3, the indium regions 320 are created by ion implanting indium into particular regions of the semiconductor device 200 using an indium dose 310. When the indium dose 310 is high enough, the ion implantation forms amorphous silicon regions in the substrate 210 and gate electrode layer 228. For instance, it is generally desirable that the indium dose 310 be greater than about 1E13 atoms/cm$^2$ to form the aforementioned amorphous silicon regions. In addition, it is generally desirable that the indium dose 310 be less than about 1E15 atoms/cm$^2$; dosages greater than this can cause undesirable indium clusters in the substrate 210 and gate electrode layer 228. Accordingly, one exemplary embodiment of the invention uses an indium dose 310 ranging from about 8E13 atoms/cm$^2$ to about 2E14 atoms/cm$^2$. Other undisclosed indium doses 310 are, however, within the scope of the invention.

As illustrated in FIG. 3, the indium regions 320 extend into the substrate 210 and gate electrode layer 228 a specific distance. When the indium dose 310 is sufficient, the indium regions 320 and amorphous silicon regions generally extend into the substrate 210 and gate electrode layer 228 a distance sufficient to surround any silicide region that may subsequently be formed therein. In most instances, it has been observed that the indium regions 320 should extend into the substrate 210 and gate electrode layer 228 from about 8 nm to about 40 nm to accomplish the aforementioned surrounding effect. Typically an ion implant energy ranging from about 5 keV to about 50 keV is sufficient to accomplish the aforementioned depths.

The indium regions 320 also extend, to some extent, under the gate structure 220, as illustrated in FIG. 3. This may be accomplished using a number of different methods; however, one particular method includes using an angled implant, such as an implant angle from greater than about 0 degrees to about 60 degrees. Implant angles of nine degrees, fifteen degrees and twenty-five degrees have been attempted, each providing some degree of benefit.

As is often the case, a quad implant (e.g., by rotating the substrate) may be used to achieve the appropriate concentration of indium in the desired portions of the semiconductor device 200 when using the angled implants. Such an embodiment is shown in FIG. 3 using the references 310a-310d, which attempt to illustrate the different incoming implant dose configurations for a quad implant. For example, an initial implant could be conducted using the angled indium dose 310a, which is rotated a number of degrees from normal and approaches the substrate 210 from the left. The implant source or the substrate could then be revolved by about 90 degrees, thus resulting in the angled implant dose 310b approaching the substrate 210 from out of the page. The implant source or the substrate 210 could again be revolved by about 90 degrees, thus resulting in the angled implant dose 310c approaching the substrate 210 from the right. The implant source or the substrate could then be revolved by about 90 degrees, thus resulting in the angled implant dose 310d approaching the substrate 210 from into the page. While a quad implant scenario has been discussed in somewhat detail, other implant scenarios, including dual, tri, etc., could also be used. After the inclusion of the indium, one or more cleaning processes may be performed on the semiconductor device 200.

Figure 4:
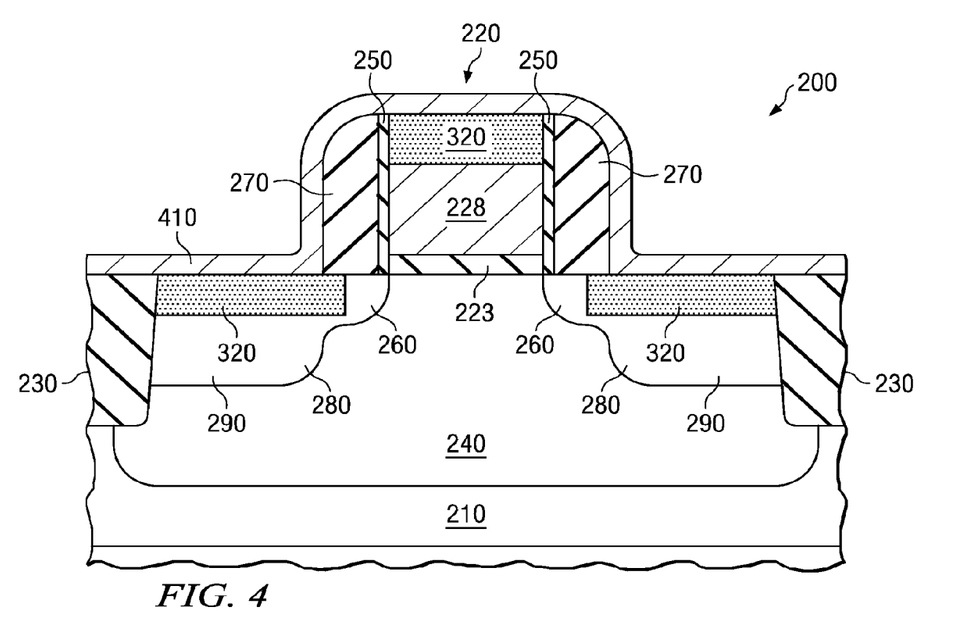
FIG. 4 illustrates the semiconductor device of FIG. 3 after forming a nickel alloy layer over the gate electrode layer and source/drain regions.

FIG. 4 illustrates the semiconductor device 200 illustrated in FIG. 3 after forming a nickel alloy layer 410 over the gate electrode layer 228 and source/drain regions 290. In one exemplary embodiment, the nickel alloy layer 410 is formed immediately following the formation of the indium regions 320. However, other embodiments exist wherein the formation of the nickel alloy layer 410 does not immediately follow the formation of the indium regions 320.

The nickel alloy layer 410 may be formed using any suitable technique used in semiconductor processing. In one embodiment, a thickness of the nickel alloy layer 410 is between about 3 nm and about 40 nm. In a more particular embodiment, a thickness of the nickel alloy layer 410 is between about 5 nm and about 15 nm.

The nickel alloy layer 410, in one embodiment, might comprise a nickel-platinum alloy. For example, the nickel might comprise about 95 wt. % of the nickel alloy layer 410 and the platinum might comprise about 5 wt. % of the nickel alloy layer 410. Other nickel alloys might also be used.

Figure 5:
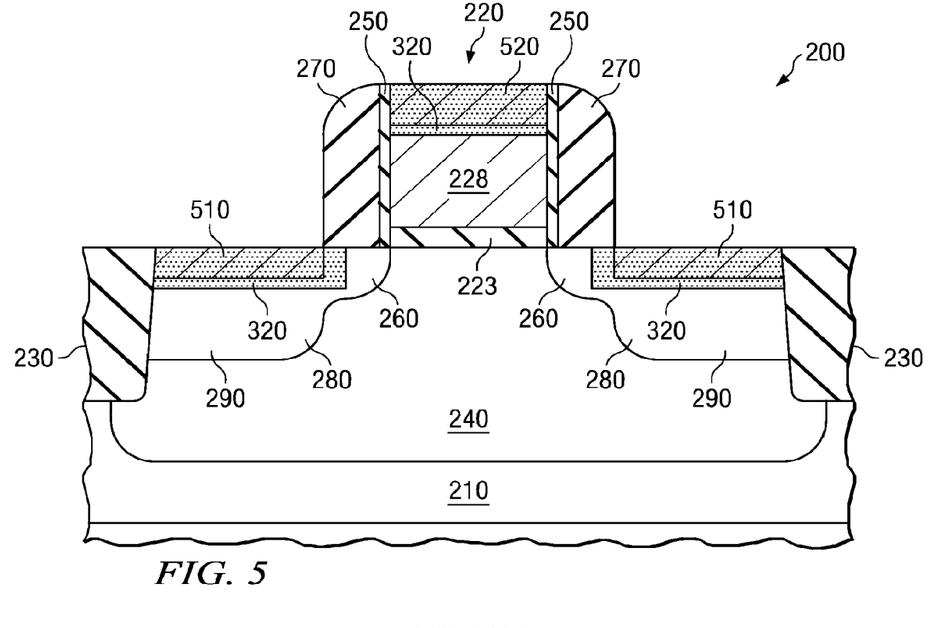
FIG. 5 illustrates the semiconductor device of FIG. 4 after subjecting the nickel alloy layer to an anneal.

FIG. 5 illustrates the semiconductor device of FIG. 4 after subjecting the nickel alloy layer 410 to an anneal, thereby causing the nickel alloy layer 410 to react with the underlying silicon regions to form nickel alloy silicides 510, 520. It should be noted that no reaction takes place in the embodiment of FIG. 5 between the nickel alloy layer 510 and the sidewall spacers 270. Notice how the nickel alloy silicides 510, 520 are located entirely within the indium regions 320 in the embodiment of FIG. 5. This is but one embodiment consistent with the principles of the invention. For example, other embodiments exist, such as shown in FIGS. 1B and 1C, wherein the nickel alloy suicides 510, 520 are not located entirely within the indium regions 320.

In some embodiments of the invention, after the silicidation process, any unreacted nickel from the nickel alloy layer 410 is stripped using any suitable stripping technique used in semiconductor processing. After the stripping of the unreacted nickel, a second silicide anneal process may be performed. In some embodiments, this additional silicide anneal forms nickel monosilicide from nickel-rich silicide. In one embodiment, this additional silicide anneal process is performed at a temperature ranging from about 300° C. to about 550° C. for a time period of between about 0.1 seconds and about 300 seconds. In a more particular embodiment, this additional silicide anneal process is performed at a temperature of approximately 400° C. for approximately thirty seconds.

In some embodiments, a solid phase epitaxial ("SPE") regrowth process may be performed by heating the substrate 210 in order to recrystallize any amorphous silicon that did not silicidize during the nickel silicidation process. In one embodiment, this SPE anneal process may be performed by heating the substrate 210 at a temperature greater than about 500° C., and more particularly between about 550° C. and about 750° C. for between about one second and about 30 minutes. In another embodiment, the SPE anneal process is performed by heating the substrate 210 to a temperature between about 550° C. and about 600° C. for between about 10 seconds and about 15 minutes. Other suitable process parameters are contemplated by the invention; for example, a second single anneal step that accommodates both the formation of the nickel monosilicide and the SPE regrowth. Nevertheless, the resulting structure should have little, if any, amorphous silicon remaining between the nickel alloy silicides 510, 520 and the source/drain regions 290 and gate electrode layer 228, respectively.

The embodiment discussed above with respect to FIGS. 2-5 represents but one embodiment of the invention. However, other embodiments exist. For example, there is also the possibility of a combination approach whereby a first implant species is used to form an initial amorphized region in the silicon, followed by an indium dose to form a completed amorphized region in the silicon. In this embodiment either the first implant species or indium could be used to play the primary amorphization function, and the order is reversible.

Figure 6:
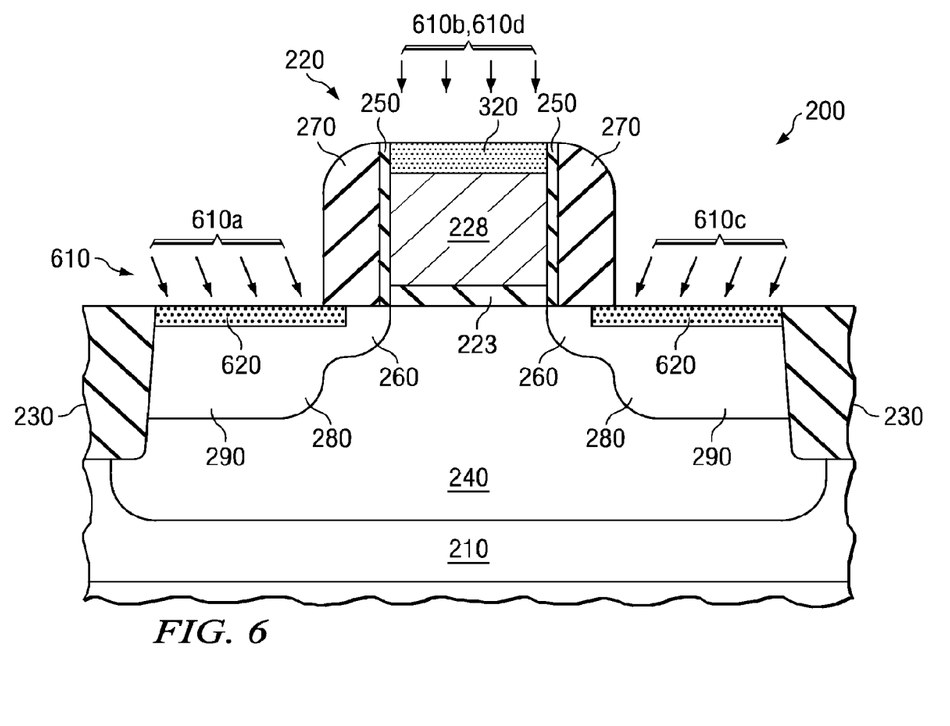
FIGS. 6-7 illustrate alternative embodiments of the invention.
Figure 7:
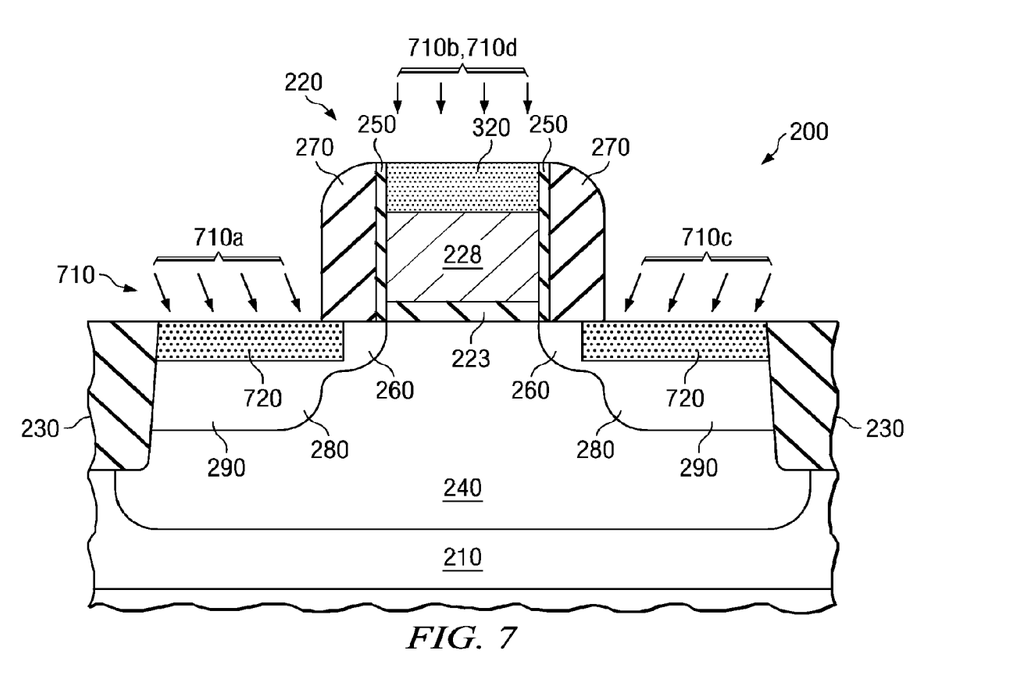
Figure 8:
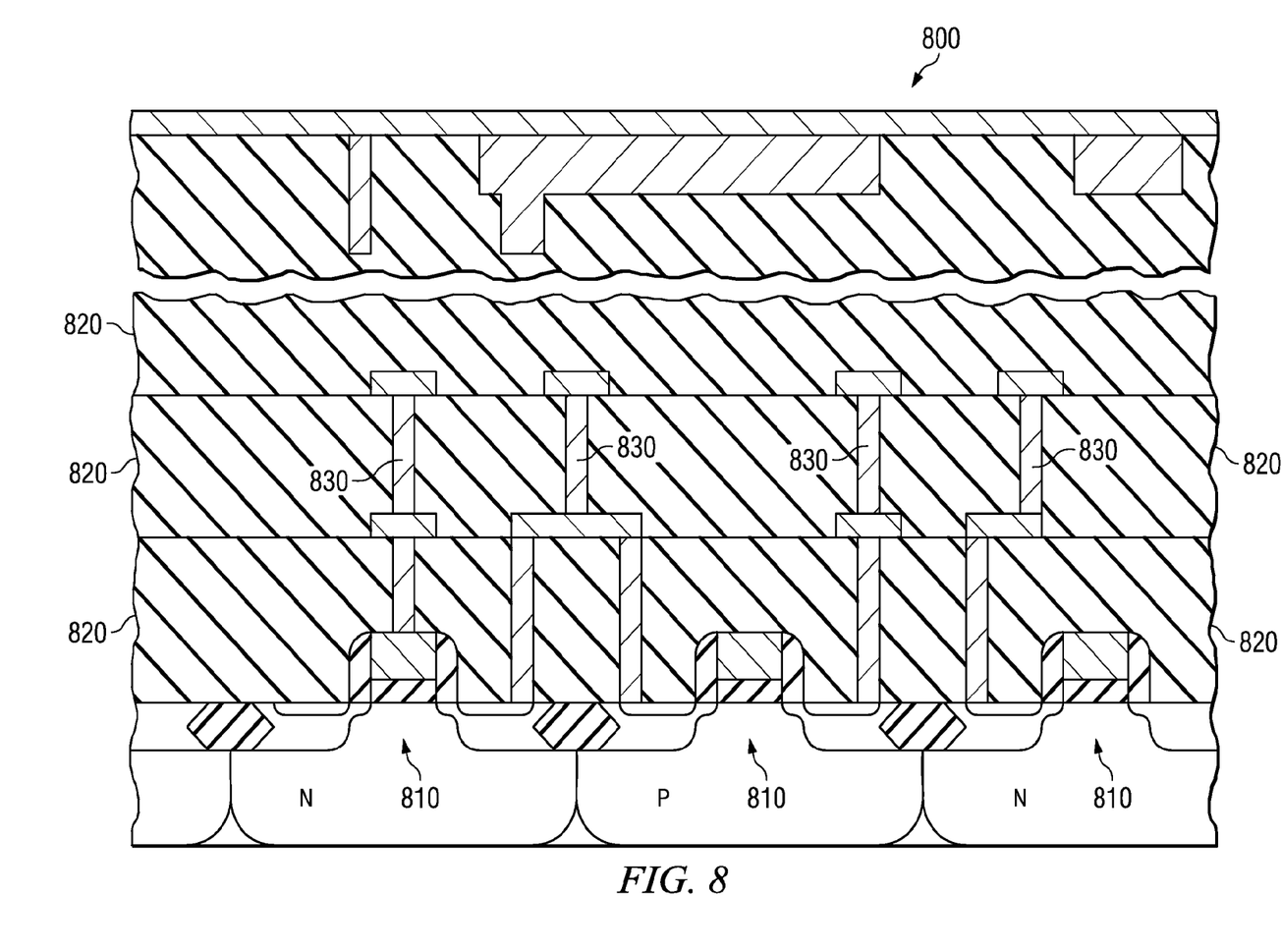
FIG. 8 illustrates an integrated circuit (IC) incorporating a semiconductor device constructed according to the principles of the invention.

This embodiment is illustrated in FIGS. 6-8, wherein like numbers are used to illustrate substantially similar features to those illustrated in FIGS. 1-4. As illustrated in FIG. 6, the semiconductor device 200 is subjected to a first implant species 610, resulting in the initial amorphized regions 620. Thereafter in FIG. 7, the semiconductor device 200 is subjected to an indium dose 710, resulting in the completed amorphized regions 720. The process could then pick back up from FIG. 4 and complete its manufacture. As previously discussed, the steps of FIGS. 6 and 7 could also be reversed.

Another embodiment, not shown, exists wherein the first implant species fully amorphizes the silicon and the indium is included in the amorphized region at a lesser dose to provide certain advantages, for instance less contact resistance between the nickel silicide region and the source/drain region or gate electrode layer. Conceivably, the lesser dose of indium could be included within the silicon prior to the first implant species, fully amorphizing the silicon and resulting in similar structures. Another embodiment, not shown, exists wherein the indium is included within the substrate prior to the annealing of the source/drain regions.

FIG. 8 illustrates an integrated circuit (IC) 800 incorporating a semiconductor device 810 constructed according to the principles of the invention. The IC 800 may include devices, such as transistors used to form CMOS devices, BiCMOS devices, Bipolar devices, or other types of devices. The IC 800 may further include passive devices, such as inductors or resistors, or it may also include optical devices or optoelectronic devices. Those skilled in the art are familiar with these various types of devices and their manufacture. In the particular embodiment illustrated in FIG. 8, the IC 800 includes the semiconductor devices 810 having dielectric layers 820 located thereover. Additionally, interconnect structures 830 are located within the dielectric layers 820 to interconnect various devices, thus, forming the operational integrated circuit 800.

Those skilled in the art to which the invention relates will appreciate that other and further additions, deletions, substitutions and modifications may be made to the described embodiments without departing from the scope of the invention.

What is claimed is:

1. A semiconductor device, comprising:
   a gate structure located over a substrate, the gate structure including a gate dielectric layer and gate electrode layer;
   source/drain regions located adjacent the gate structure; and
   a nickel alloy silicide located in the source/drain regions, the nickel alloy silicide having indium located therein, wherein the indium extends beyond the nickel alloy silicide and is located at an interface between the nickel alloy silicide and the source/drain regions.

2. The semiconductor device as recited in claim 1 wherein the amount includes a peak concentration of indium greater than about 1E19 atoms/cm$^3$.

3. The semiconductor device as recited in claim 1 wherein the nickel alloy silicide is a first nickel alloy silicide and further including a second nickel alloy silicide located within the gate electrode layer.

4. The semiconductor device as recited in claim 1 wherein the nickel alloy silicide is a nickel platinum silicide.

5. The semiconductor device as recited in claim 1 further including one or more interconnects located within dielectric layers formed over the gate structure, at least one interconnect contacting the nickel alloy silicide.

* * * * *